United States Patent [19]

Koshy et al.

[11] Patent Number: 5,741,747
[45] Date of Patent: Apr. 21, 1998

[54] CERAMIC SUBSTRATE FOR BI-CUPRATE SUPERCONDUCTORS AND A PROCESS FOR PREPARING THE SAME

[75] Inventors: Jacob Koshy; Jose Kurian; Poo Kodan Sajith; Krishnan Sudersan Kumar; Rajan Jose; Asha Mary John; Alathur Damodaran Damodaran, all of Trivandrum, India

[73] Assignee: Council of Scientific & Industrial Research, New Delhi, India

[21] Appl. No.: 758,243

[22] Filed: Nov. 27, 1996

[30] Foreign Application Priority Data

May 16, 1996 [IN] India .................... 1028/DEL/96

[51] Int. Cl.$^6$ .................................................. C04B 35/48
[52] U.S. Cl. ........................... 501/135; 501/104; 501/152
[58] Field of Search ........................ 501/135, 104, 501/152; 505/239

[56] References Cited

U.S. PATENT DOCUMENTS 5,635,453  6/1997  Pique et al. .................... 505/239

FOREIGN PATENT DOCUMENTS 61-281067  12/1986  Japan .

*Primary Examiner*—Melissa Bonner
*Attorney, Agent, or Firm*—Abelman, Frayne & Schwab

[57] ABSTRACT

A novel ceramic substrate useful for the preparation of superconductors, said substrate having the formula $Ba_2DyMO_{5.5}$ where M represents at least one of the metals Zr, Sn and Hf and a process for the preparation of said ceramic substrate, which comprises (i)Reacting salts of dysprosium, barium and Zr, Sn or Hf in an organic medium, (ii) Pressing the resultant mixture in the form of pellets, (iii)Calcining the pellets by heating at a temperature in the range of 1000° to 1200° C., (iv)Repeating the calcination process for 30–45 h at temperature in the range of 1000°–1200° C. until a highly homogenous mixture is formed, (v)Grinding the calcined material and pelletizing at a pressure in the range of 3 to 4 tons/cm$^2$, (vi) Sintering the resultant product at a temperature in the range of 1200° to 1600° C. for a period of 10 to 30 h, and then furnace cooled to room temperature.

1 Claim, 8 Drawing Sheets

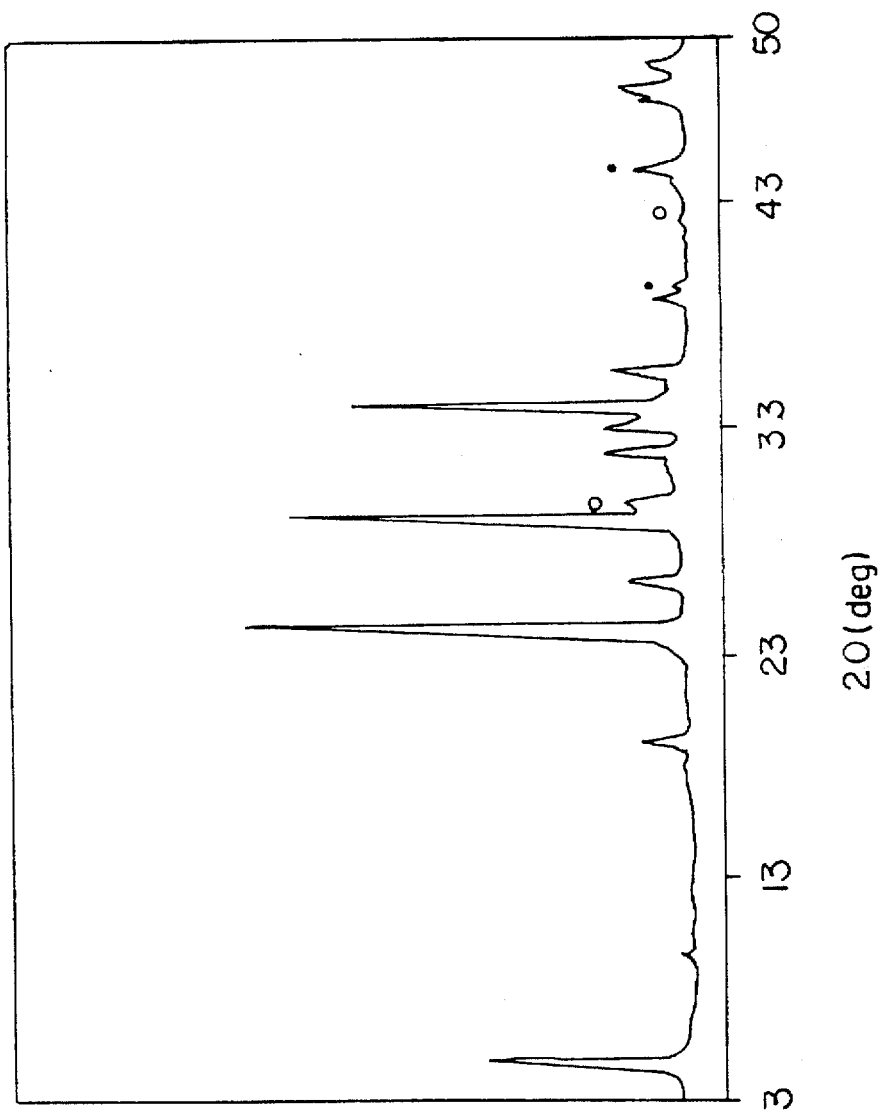

CERAMIC SUBSTRATE FOR BI-CUPRATE SUPERCONDUCTORS AND A PROCESS FOR PREPARING THE SAME

FIELD OF THE INVENTION

The invention relates to a novel ceramic substrate of formula $Ba_2DyMO_{5.5}$ wherein M=Zr, Sn and Hf, a process for the preparation of said ceramic substrates for Bi-cuparate superconductors, Bi-cuparate superconductors and a process for the preparation of phase pure superconducting Bi(2223) and Bi(2223)-Ag thick films on these newly developed substrate.

PRIOR ART OF THE INVENTION

The immediate application of high $T_c$ superconductors is likely to be in the form of thick and thin films in electronic devices [Alford N. McN et al., Supercond. Sci. Technol. 4 (1991) 433; Pinto, R. et al., Applied Superconductivity 1 (1993) 1]. In the preparation of superconducting films, substrates play a vital role and the high chemical reactivity of Bi-cuprate superconductors imposes severe restrictions on the materials available for their use as substrates for Bi-cuprate superconductors [McGinnis, W. C. et al. J. Mater. Res. 7 (1992) 585]. Besides for microwave applications, the substrate should have a low dielectric constant and loss factor at $Gh_z$ frequencies [Preng, L. H. et al., Supercond. Sci. Technol. 3 (1990) 233]. To the best of our knowledge, MgO is the only substrate suitable for Bi-cuparate films for microwave applications. However, the Bi(Pb)SrCaCuO [BiSCCO] films developed on MgO contained mixed phases of both low $T_c$, Bi(2212)[$T_{c(o)}$=80K] and high Tc. Bi(2223) [$T_{c(o)}$=110K] (McGinnis, W. C. et al., j. Mater. Res. 7 (1992) 585; Agarwal, A. et al., Supercond. Sci. Technol. 6 (1993) 670]. Other commercially available substrates such as Si, $SiO_2$, $Al_2O_3$ and $SrTiO_3$ etc. are either chemically reactive with BiSCCO superconductor or have high dielectric constant and loss factor which makes superconductor or have high dielectric constant and loss factor which makes them unsuitable or less attractive for microwave applications.

We have now developed new substrate materials, $Ba_2DyMO_{5.5}$ (M=Zr, Sn and Hf) which are found to be non-reacting with BiSCCO superconductor even at extreme processing conditions and have low dielectric constant and loss factors. We have produced phase pure Bi(2223) and Bi(2223)-Ag thick films with $Tc_{(o)}$=110K and high critical current density ($-10^4$ A/cm$^2$) on these substrates.

OBJECTS OF THE INVENTION

Thus, the main objective of the present invention is to provide ceramic substrates of $Ba_2DyMO_{5.5}$ (M=Zr, Sn and Hf), a process for the preparation of said ceramic substrates, Bi-cuparate superconductors and a process for the preparation of single phase Bi(2223) and Bi(2223)-Ag thick films of $Tc_{(o)}$=110K and high critical current density on these substrates.

To meet these objectives, the present invention provides novel ceramic substrate of formula $Ba_2DyMO_{5.5}$, a process for the preparation of superconducting Bi(2223) and Bi(2223)-Ag thick films on the new substrate and the superconductor produced by the process.

Accordingly, one embodiment of the present invention relates to a process for producing new ceramic substrates of the formula $Ba_2DyMO_{5.5}$ where M represents metals Zr, Sn and Hf, useful for the preparation of superconducting films thereon, which comprises:

(i) mixing salts of Dysprosium, barium and Zr, Sn and Hf in an organic medium,
(ii) pressing the resultant mixture in the form of pellets,
(iii) calcining the pellets by heating at a temperature in the range of about 1000° to about 1200° C.
(iv) repeating the calcination process altogether not exceeding for about 30 to about 45 h, preferably about 12 h for each calcination, at temperature in the range of about 1000° to about 1200° C. till a highly homogeneous mixture is formed,
(v) grinding the calcined material and pelletising at a pressure in the range of about 3 to about 4 tonns/cm$^2$, and
(vi) sintering the resultant product at a temperature in the range of about 1200° to about 1600° C. for a period of about 10 to about 30 h preferably about 20 h and then furnace cooled to room temperature.

The salts of disprosium, barium and other metals used may be selected from oxides, carbonates or nitrates. The purity of the salts may be of 99.9%. The organic medium used may be selected from organic solvents such as acetone, ethyl alcohol, isopropyl alcohol. Multiple calcinations (preferably three times) of the pellets may be conducted at temperatures of about 1000° to about 1200° C. for a period ranging from about 10 to about 15 h preferably about 12 h for each calcination. The sintering of the final product may be effected for a period of about 10 to about 30 h preferably for about 20 h.

In view of the suitability of $Ba_2DyMO_{5.5}$ substrates, we have successfully screen-printed/dip-coated thick films of Bi(2223) and Bi(2223)-Ag with a zero resistivity superconducting transition at 110K on these substrates.

Thus, yet another aspect of the present invention relates to a process for the preparation of superconducting Bi(2223) and Bi(2223)-Ag thick films on new ceramic substrates of the formula $Ba_2DyMO_{5.5}$ where M represents metals namely, Zr, Sn and Hr, useful for the preparation of superconducting films which comprises:

(i) mechanically polishing the ceramic substrate of the above said formula to get highly smooth and shining surfaces,
(ii) preparing thick films of Bi(2223) and Bi(2223)-Ag composites with 5–10 Vol % of Ag by known methods,
(iii) (a) screen printing Bi(2223) and Bi(2223)-Ag on said polished $Ba_2DyMO_{5.5}$ substrates using a mess size in the range of 325, or (b) dip-coating Bi(2223) and Bi(2223)-Ag on said polished $Ba_2DyMO_{5.5}$ using a suspension of the respective powder with an organic solvent.
(iv) drying the resultant films at a temperature in the range of about 100° to about 150° C.,
(v) heating the dried films at a rate of about 200° to about 300° C./h upto about 860°–880° C. and soaking at this temperature about 1 to about 5 minutes,
(vi) cooling the film at a rate of about 10° C./h to bring down the temperature to about 845° C. and keeping the films at this temperature for a period of 2–4 h, and
(vii) Cooling the film at a rate of about 200° C./h upto room temperature.

All the above steps are being carried out in the presence of air or oxygen.

The details of the invention is described in the Examples given below which are provided by way of illustration only and should not be constructed to limit the scope of the invention.

BRIEF DESCRIPTION OF THE DRAWINGS

FIGS. 3(a)–3(c) is the XDR patterns for thick films of Bi(2223) on $Ba_2DySnO_{5.5}$.

EXAMPLE 1

Preparation of Ceramic Substrates of the Formula $Ba_2DyZrO_{5.5}$ $Ba_2DyZrO_{5.5}$ was prepared by solid state reaction method. $Dy_2O_3$, $BaCO_3$ and $ZrO_2$ (purity 99.9%) were taken in stoichiometric ratio, mixed thoroughly in acetone media and calcined in air at 1150° C. for 45 h with two intermediate grindings. The resultant mixture was powdered and pressed at a pressure of 5 tons/cm², in the form of circular pellets and sintered in air at 1450° C. for 20 h.

EXAMPLE 2

Preparation of Ceramic Substrate of the Formula $Ba_2DySnO_{5.5}$ $Ba_2DySnO_{5.5}$ was prepared by solid state reaction method. $Dy_2O_3$, $BaCO_3$ and $SnO_2$ (purity 99.9%) were taken in stoichiometric ratio, mixed thoroughly in acetone and calcined in air at 1100° C. h with two intermediate grindings. The resultant mixture was powdered and pressed at a pressure of 4 tons/cm² in the form of circular pellets and sintered in air at 1360° C. for 20 h.

Structural Determination

Figure 1:
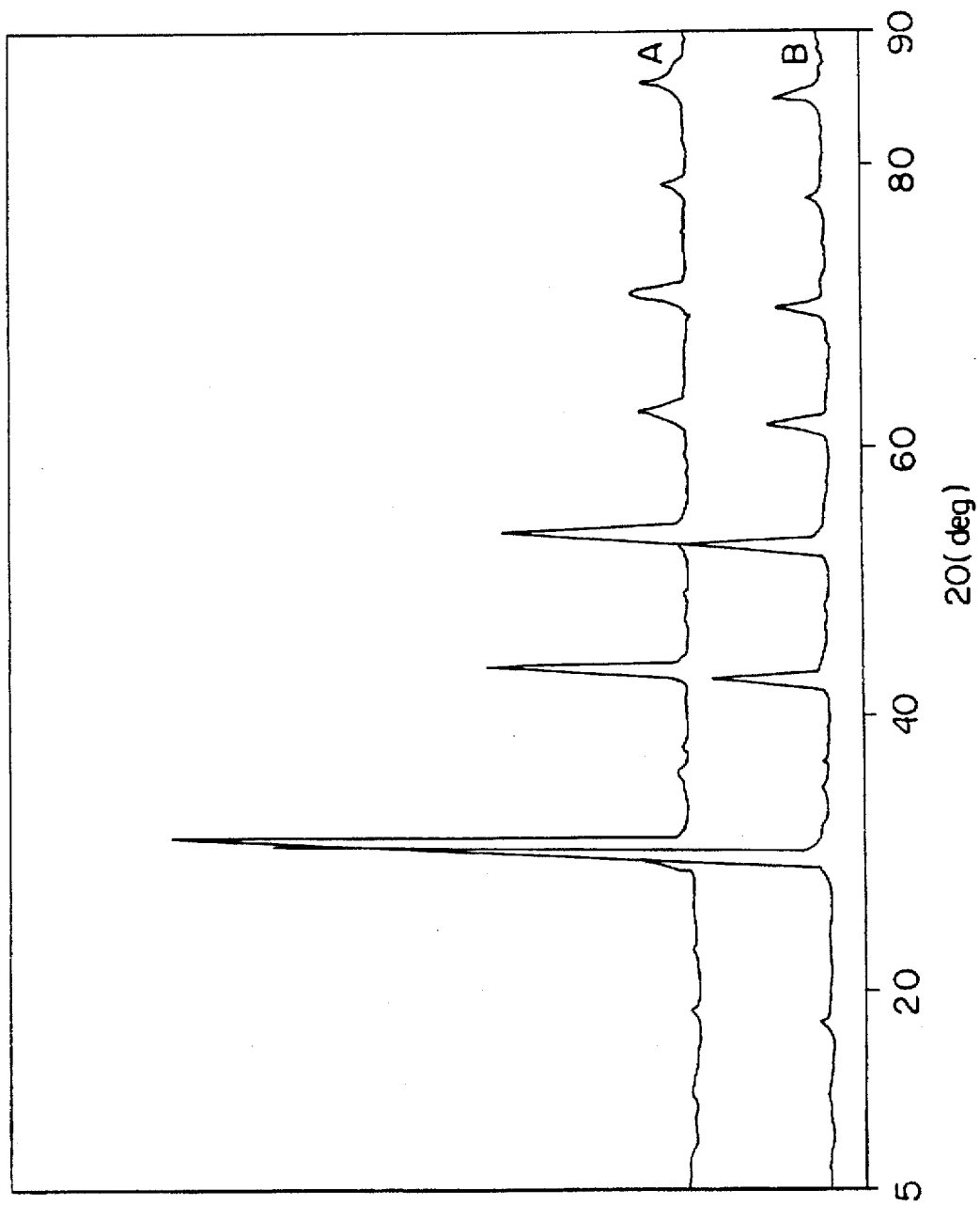
FIG. 1 is the typical XRD pattern for $Ba_2DySnO_{5.5}$ and $Ba_2DyZrO_{5.5}$

The structure of the sintered material was examined by X-ray diffraction (XRD) method and it is found that all these materials are isostructural having a cubic perovskite structure as shown in the XRD patterns in FIG. 1 (sheet No. 1) of the drawings accompanying this specification for two typical samples $Ba_2DyZrO_{5.5}$ (Example 1) and $Ba_2DySnO_{5.5}$ (Example 2). In table 1a and b, we have given the computerised XRD data for these materials.

Dielectric Properties

The dielectric properties of the substrate materials were measured in the range 30 Hz to 13 MHz frequencies and values of the dielectric constant ($\epsilon'$) and loss factor (tan $\delta$) at 13 MHz, frequency are 12 and $10^{-3}$ respectively at room temperature. At GHz frequencies the values of $\epsilon'$ and tan $\delta$ are found to be 10 and $10^{-5}$ respectively, which are ideally suitable for microwave applications.

Chemical Compatibility of $Ba_2DyMO_{5.5}$ with Bi(2223) Superconductor

Figure 2:
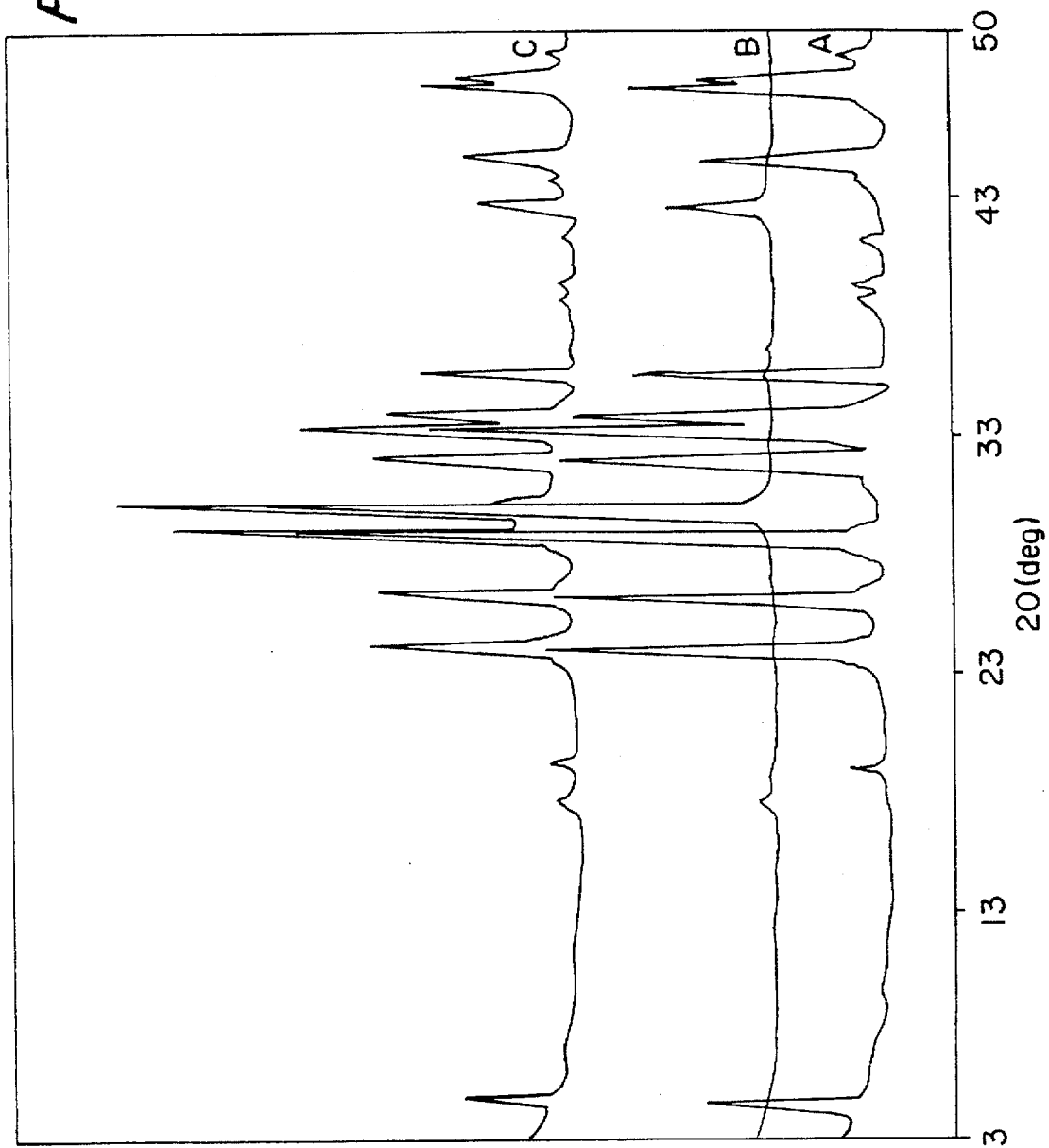
FIG. 2 is the XRD pattern for a 1:1 vol % mixture of $Ba_2DySnO_{5.5}$ and Bi(2223).

The most important characteristics of a material to be used as a substrate for superconductors is its chemical non-reactivity with the superconductor at the processing temperature. The chemical reactivity between $Ba_2DyMO_{5.5}$ and Bi(2223) was studied by mixing 1:1 vol % of $Ba_2DyMO_{5.5}$ and Bi(2223) and annealing the present pellet at 850° C. for 20 h. The XRD pattern of the annealed 1:1 vol % mixture of $Ba_2DySnO_{5.5}$ and Bi(2223) is shown in FIG. 2 (sheet No.2). The XRD pattern in the two phases in line c in FIG. 2 is compared with those of pure Bi(2223) (line a in FIG. 2) and pure $Ba_2DySnO_{5.5}$ (line b in FIG. 2). FIG. 2 shows that there is no additional phase formed, not even Bi(2212) in the annealed composite sample other than those of Bi(2223) and $Ba_2DySnO_{5.5}$. This clearly indicates that there is no chemical reaction between $Ba_2DySnO_{5.5}$ and Bi(2223), even at the extreme processing conditions. Detailed percolation studies carried on $Ba_2DySnO5$ Bi(2223) composites confirmed that the Bi(2223) and $Ba_2DySnO_{5.5}$ are found to remain as separated phases with their own charateristic even under severe heat treatment suggesting that $Ba_2DySnO_{5.5}$ can be ideal substrate material for Bi(2223). $Ba_2DySnO_{5.5}$ are insulating peovskite oxides with resistivity of the order of 10 ohm.cm.

In view of the suitability of $Ba_2DySnO_{5.5}$ substrates, we have successfully screen-printed/dip-coated thick films of Bi(2223) and Bi(2223)-Ag with $Tc_{(o)}$=110K on these substrates.

Figure 3A:
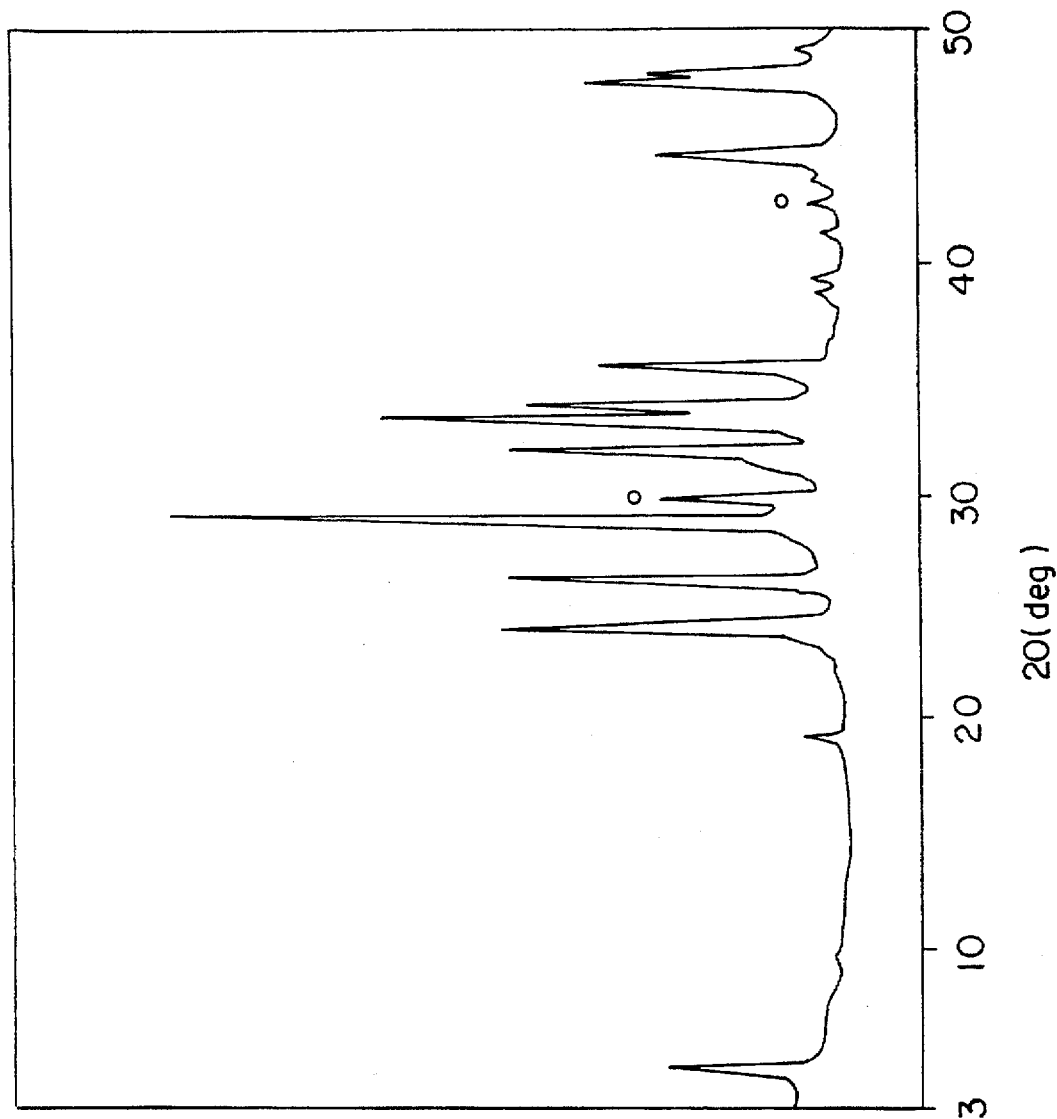
Figure 3B:
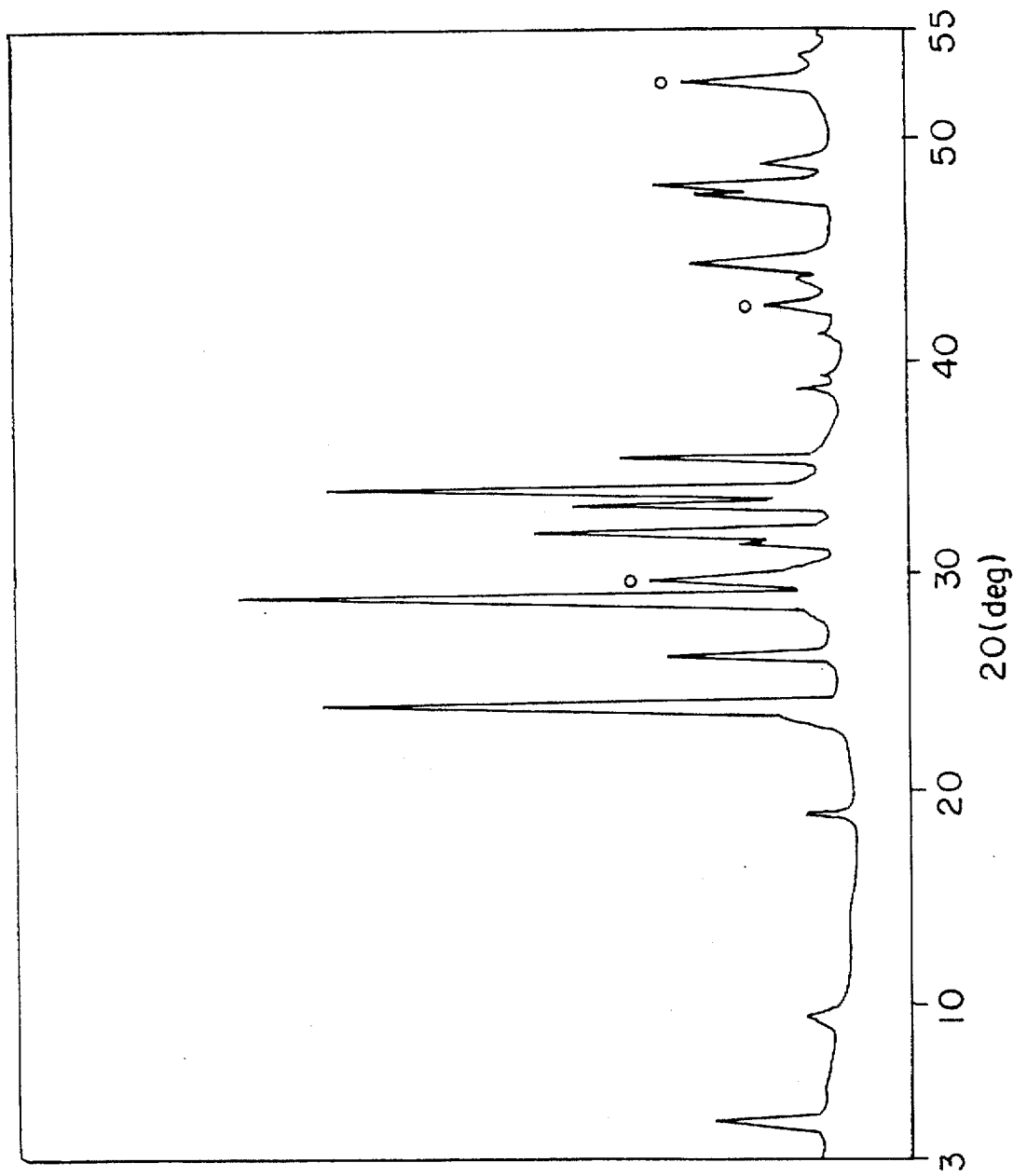

The present process for fabrication of Bi(2223) and Bi(2223)-Ag by screen printing/dip coating thick films on $Ba_2DySnO_{5.5}$ substrates is given below:

Before screen-printing/dip-coating Bi(2223) and Bi(2223)-Ag, $Ba_2DySnO_{5.5}$ substrates were mechanically polished to get highly smooth and shining surfaces. For screen printing thick film paste of Bi(2223) and Bi(2223)-Ag were made by mixing respective powder with an organic vehicle. Film thickness was controlled via viscosity control of the thick film paste. This thick film paste was then screen-printed on $Ba_2DySnO_{5.5}$ substrates using a mesh size of 325. In the case of dip-coating the suspension of Bi(2223) and Bi(223)-Ag were prepared by mixing their respective fine powders separately in an organic medium and the viscosities were controlled by the addition of commercially available fish oil. Thick films of Bi(2223) and Bi(2223)-Ag were prepared by dipping polished $Ba_2DySnO_{5.5}$ substrates into respective suspension. screen printed/dip-coated films were dried at 100° to 150° C. for 2 to 3 h. Dried films were heated in a programmable furnace at a rate of 200° to 300° C. h upto 860°–880° C. and soaked at this temperature for 5 min. The films were cooled down at a rate of 10° C./h and brought down to 845° c and kept at this temperature for 2–4 h and films were then cooled down to room temperature at a rate of 200° C. All the above processes were done in air. The structure of the films were examined by X-ray diffraction method and XRD patterns of these typical thick films of Bi(2223) on $Ba_2DySnO_{5.5}$ are shown in FIGS. 3(a)–3(c). The XRD patterns of these(2223) thick films showed that except for the characteristic peaks of $Ba_2DySnO_{5.5}$ substrates, all other peaks could be assigned to a phase pure Bi(2223) superconductor.

The following examples illustrate the preparation of superconducting film employing the novel substrates.

EXAMPLE 3

Preparation of Superconducting Bi(2223) Thick Film on Ceramic Substrate of Formula $Ba_2DySnO_{5.5}$ Highly polished polycrystalline $Ba_2DySnO_{5.5}$ substrate was used for the fabrication of Bi(2223) thick films. Thick films paste of Bi(2223) was prepared by mixing Bi(2223) with n-butanol. The viscosity of the paste was controlled by the addition of commercially available fish oil. This paste was then screen printed on $Ba_2DySnO_{5.5}$ substrate using a screen of 325 mesh size. The printed film was then dried in an oven at 200° C. for 3 h. The film was then heated in a programmable furnace in air at a rate of 200° C./h upto 880° C. and was kept at this temperature for two minutes. It was then cooled at a rate of 10° C./h upto 845° C. and kept at this temperature for 3 h and finally furnace cooled to room temperature.

EXAMPLE 4

Preparation of Superconducting Bi(2223) Thick Film on Ceramic Substrate of Formula $Ba_2DySnO_{5.5}$ The thick film suspension of Bi(2223) for dip-coating was prepared by mixing fine powder of Bi(2223) with n-butanol and the viscosity was controlled by the addition of fish oil. The thick film of Bi(2223) was prepared by dipping highly polished $Ba_2DySnO5.5$ substrate in the Bi(2223) suspension. The film is then dried in an electric oven at 150° C. for 3 h. The dried film was then heated in a programmable furnace at a rate of 200° C./h upto 880° C. and kept at this temperature for 3 min. The film was then cooled down upto 845° C. at a rate of 10° C./h and kept at this temperature for 3 h. It was then cooled at a rate of 200° C./h to room temperature. The entire process was carried out in air.

EXAMPLE 5

Preparation of Superconducting Bi(2223)-Ag Thick Film on Ceramic Substrate of Formula $Ba_2DySnO_{5.5}$ Thick film suspension of Bi(2223)-Ag for dip-coating was made by mixing superconducting Bi(2223)-Ag composite powder with n-butanol. Thick film of Bi(2223) -Ag composite having 7 vol % of Ag was fabricated by dipping highly polished $Ba_2DySnO_{5.5}$ substrate in this suspension. The coated film was kept in an electric oven at 200° C. for 3 h, to remove the organic solvent present in the film. The film was then heated in a programmable furnace in air at a rate of 300° C./h upto 870° C. and kept at this temperature for 2 min and cooled at a rate of 10° C./h upto 845° C. and kept at this temperature for 3 h. The film was then cooled at room temperature.

Figure 4A:
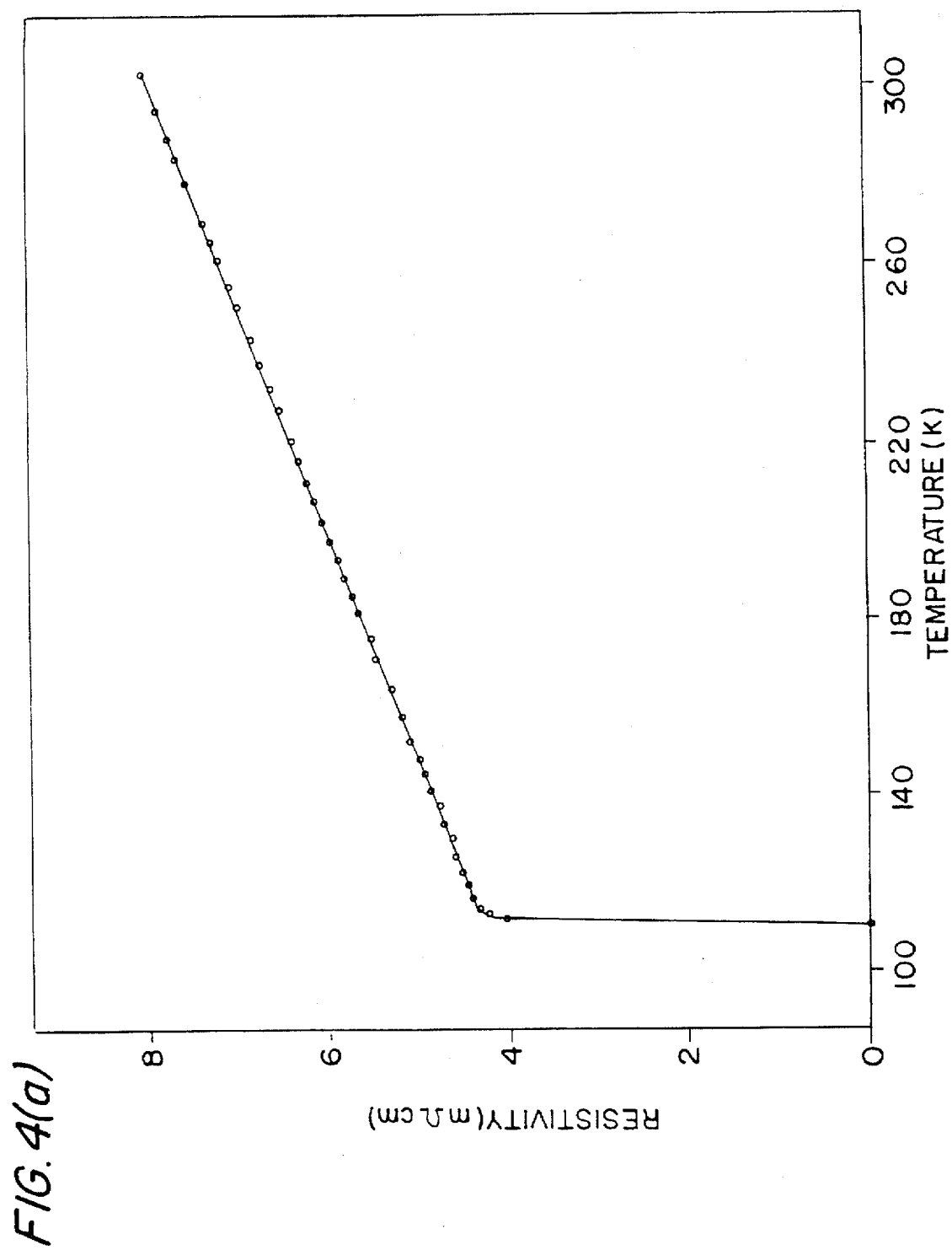
FIGS. 4(a)–4(c) is the temperature-resistance measurements for thick films of Bi(2223) on $Ba_2DySnO_{5.5}$.
Figure 4B:
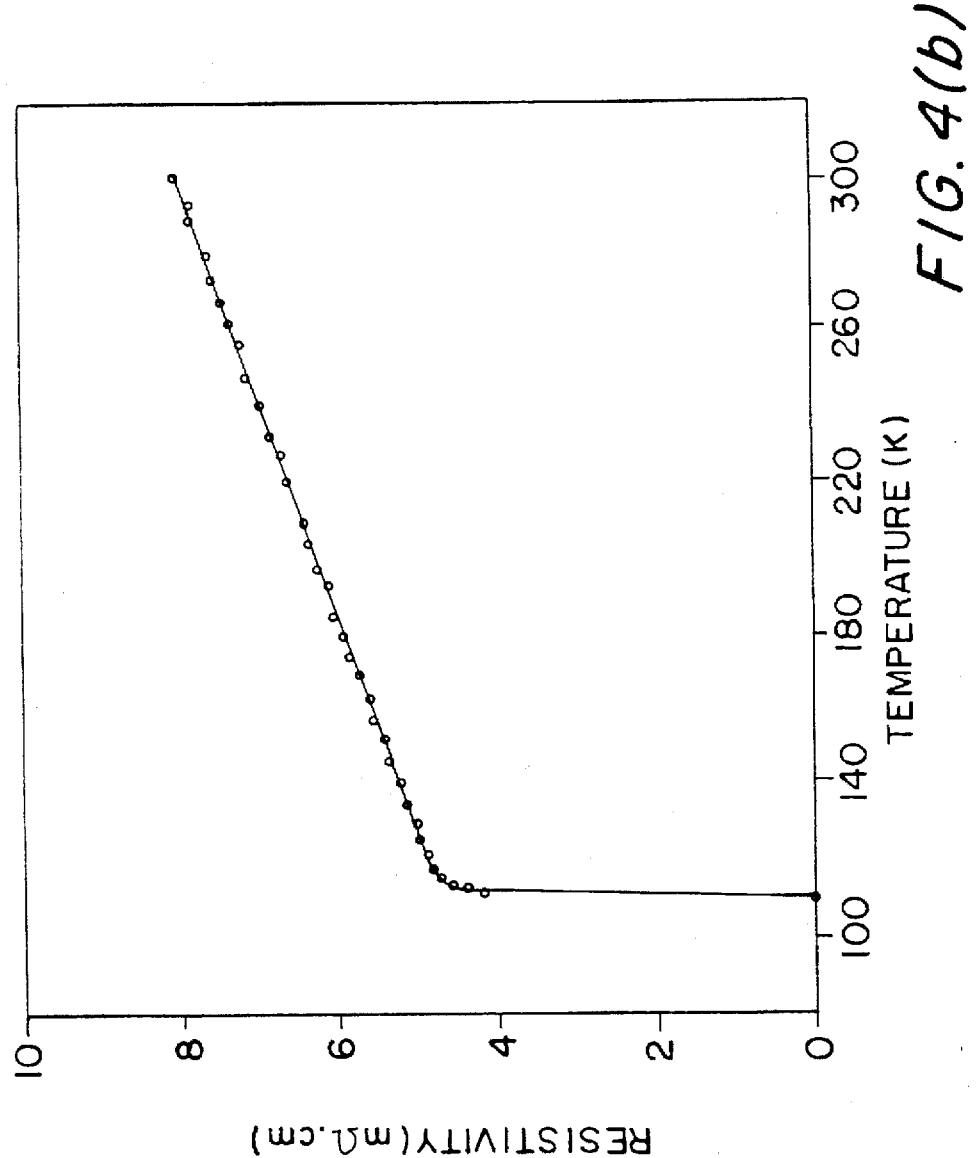
Figure 4C:
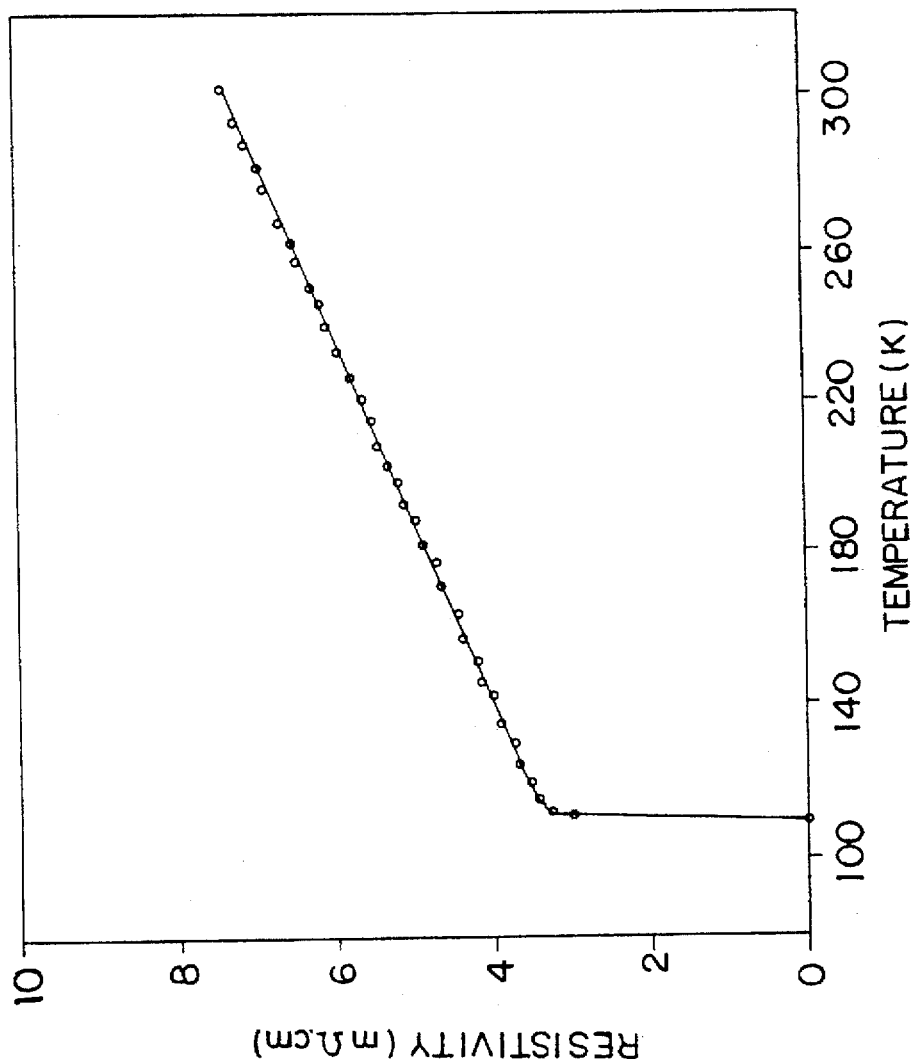

The structure of the film was examined by X-ray diffraction technique. The XRD patterns of three typical thick films on $Ba_2DySnO_{5.5}$ (example 3). $Ba_2DySnO_{5.5}$ (example 4) and $Ba_2DySnO_{5.5}$ (example 5) substrates are shown in FIGS. 3(a), (b) & (c) of the drawings accompanying this specification. The XRD pattern of these Bi(2223) thick films showed that except for the characteristic peaks of $Ba_2DySnO_{5.5}$ substrates, all other peaks could be assigned to a phase pure Bi (2223) superconductor. Superconductor in these Bi(2223) thick films on $Ba_2DySnO_{5.5}$ substrates were studied by temperature-resistance measurements shown in FIGS. 4(a)–4(c). The films show a metallic behavior in the normal state and give zero resistivity superconducting transition at 110 k.

TABLE 1(a)

X-ray diffraction data of $Ba_2DyZrO_{5.5}$

| No. | 2 θ | d | I/I$_o$ | hkl |
|---|---|---|---|---|
| 1 | 29.830 | 2.993 | 100 | 220 |
| 2 | 35.360 | 2.545 | 10 | 311 |
| 3 | 42.920 | 2.105 | 53 | 400 |
| 4 | 48.380 | 1.880 | 15 | 420 |
| 5 | 53.140 | 1.722 | 51 | 422 |
| 6 | 62.170 | 1.492 | 22 | 440 |
| 7 | 70.460 | 1.335 | 23 | 620 |
| 8 | 78.680 | 1.215 | 15 | 444 |
| 9 | 85.720 | 1.132 | 20 | 642 |

TABLE 1(b)

X-ray diffraction data of $Ba_2DySnO_{5.5}$

| No. | 2 θ | d | I/I$_o$ | hkl |
|---|---|---|---|---|
| 1 | 17.480 | 5.069 | 9 | 111 |
| 2 | 29.720 | 3.004 | 100 | 220 |
| 3 | 34.900 | 2.569 | 7 | 311 |
| 4 | 36.560 | 2.456 | 7 | 222 |
| 5 | 42.530 | 2.124 | 25 | 400 |
| 6 | 52.690 | 1.736 | 32 | 422 |
| 7 | 61.660 | 1.503 | 15 | 440 |
| 5 | 69.930 | 1.344 | 13 | 620 |
| 9 | 77.650 | 1.229 | 9 | 444 |
| 10 | 85.470 | 1.135 | 12 | 642 |

We claim:

1. A novel ceramic substrate useful for the preparation of superconductors, said substrate having the formula $Ba_2DyMO_{5.5}$ where M represents Zr and/or Hf.

* * * * *